(12) United States Patent
Yoshizawa et al.

(10) Patent No.: US 7,568,281 B2
(45) Date of Patent: Aug. 4, 2009

(54) SUBSTRATE ACCOMMODATING TRAY PALLET AND SUBSTRATE TRANSFER SYSTEM

(75) Inventors: Takenori Yoshizawa, Tsu (JP); Hideo Taniguchi, Tsu (JP); Hiroto Shibata, Sendai (JP)

(73) Assignees: Sharp Kabushiki Kaisha, Osaka-Shi (JP); Sydek Corporation, Sendai-Shi (JP)

( * ) Notice: Subject to any disclaimer, the term of this patent is extended or adjusted under 35 U.S.C. 154(b) by 502 days.

(21) Appl. No.: 10/947,235

(22) Filed: Sep. 23, 2004

(65) Prior Publication Data

US 2005/0069402 A1 Mar. 31, 2005

(30) Foreign Application Priority Data

Sep. 26, 2003 (JP) .............................. 2003-336499

(51) Int. Cl.
*H05K 3/30* (2006.01)
(52) U.S. Cl. ..................... 29/740; 29/759; 198/465.1; 414/286
(58) Field of Classification Search ................... 29/721, 29/739, 744, 771, 789, 56.6; 414/785, 787, 414/276, 239; 198/465.1
See application file for complete search history.

(56) References Cited

U.S. PATENT DOCUMENTS

| | | | | |
|---|---|---|---|---|
| 4,556,362 A | * | 12/1985 | Bahnck et al. ........... 414/744.3 |
| 4,932,828 A | * | 6/1990 | Katae et al. .................. 414/286 |
| 5,135,098 A | * | 8/1992 | Koibuchi .................. 198/345.1 |
| 5,203,661 A | * | 4/1993 | Tanita et al. ........... 414/331.16 |
| 5,664,322 A | * | 9/1997 | Best ............................. 29/784 |
| 5,709,303 A | * | 1/1998 | Best ........................ 206/459.1 |
| 5,859,832 A | * | 1/1999 | Osada ....................... 369/30.7 |
| 6,583,385 B1 | * | 6/2003 | Sinkunas et al. ....... 219/121.85 |
| 6,594,887 B1 | * | 7/2003 | Okuda et al. .................. 29/739 |
| 6,642,485 B2 | * | 11/2003 | Goenka et al. .............. 219/400 |
| 6,857,559 B2 | * | 2/2005 | Goenka ...................... 228/200 |
| 6,949,143 B1 | * | 9/2005 | Kurita et al. ................. 118/719 |
| 7,014,415 B2 | * | 3/2006 | Yoshizawa ............... 414/797.5 |
| 2004/0154529 A1 | * | 8/2004 | Nogiwa et al. .............. 117/200 |

FOREIGN PATENT DOCUMENTS

| | | |
|---|---|---|
| JP | 10-287382 A | 10/1998 |
| JP | 11-59893 A | 3/1999 |
| JP | 2001-326272 A | 11/2001 |
| JP | 2002-348903 A | 12/2002 |

\* cited by examiner

*Primary Examiner*—Minh Trinh
(74) *Attorney, Agent, or Firm*—Birch, Stewart, Kolasch & Birch, LLP

(57) ABSTRACT

A substrate accommodating tray pallet has a substrate in a horizontal state, includes openings for inserting substrate removal tools for raising the substrate, and is used for transferring substrate accommodating trays which can be vertically stacked, wherein: the substrate accommodating trays are to be mounted on an upper surface; and substrate removal tool insertion openings for inserting the substrate removal tools are positioned so as to oppose openings of the mounted substrate accommodating trays.

2 Claims, 14 Drawing Sheets

SUBSTRATE ACCOMMODATING TRAY PALLET AND SUBSTRATE TRANSFER SYSTEM

This Nonprovisional application claims priority under 35 U.S.C. §119(a) on Patent Application No. 2003-336499 filed in Japan on Sep. 26, 2003, the entire contents of which are hereby incorporated by reference.

BACKGROUND OF THE INVENTION

1. Field of the Invention

The present invention relates to a substrate accommodating tray pallet used for transporting and transferring a substrate, and a substrate transfer system using the substrate accommodating tray pallet. The substrate is a display glass substrate, for example, and used for a display panel of a liquid crystal display device or the like.

2. Description of the Related Art

A display panel for a liquid crystal display device usually includes a pair of display glass substrates opposed to each other and sealed together, and a liquid crystal material sealed between the pair of glass substrates. Recently, glass substrates having a thickness of 0.7 mm or less are widely used for such a display panel. As the glass substrates are increasing in size, the planar area of the glass substrates which are carried to the display panel production plants is increasing, and even glass substrates having a side length of 1.3 m or greater are used.

Such a large and thin glass substrate easily warps and tends to break. Thus, handling of the glass substrate is difficult. Therefore, there is a problem that it is impossible to transport a number of glass substrates with a high efficiency. In order to solve these problems, Japanese Laid-Open Publication No. 10-287382 discloses a substrate accommodating tray for accommodating one glass substrate. A substrate accommodating section of the substrate tray cassette has a lattice structure. The substrate accommodating tray is structured such that a plurality of substrate accommodating trays can be stacked vertically. Such a substrate accommodating tray allows a large and thin glass substrate to be accommodated without warping and thus without being broken during transportation. Since a greater number of substrate tray cassettes can be stacked vertically for transportation and storage, the space efficiency can be improved, and a number of glass substrates cab be transported efficiently.

When a plurality of substrate accommodating trays stacked vertically are transported, a number of vertically stacked substrate accommodating trays are usually mounted on a pallet for transferring into a truck and carrying into a production plant.

When a number of the substrate accommodating trays stacked are carried into a production plant, it is necessary to separate the vertically stacked substrate accommodating trays from each other to remove a glass substrate from each of the substrate accommodating trays. In order to remove a glass substrate from each of the substrate accommodating trays, the following method is employed, for example. Each of the substrate accommodating trays includes an opening on a bottom. Through the opening, a substrate removal tool which has a pin shape is inserted to raise a glass substrate accommodated in the substrate accommodating tray. The substrate is removed by a substrate transfer device which has an arm shape.

In such a case, it is necessary to separate the vertically stacked substrate accommodating trays one by one and to transfer the separated substrate accommodating trays to a position where the substrate removal tool is provided. Thus, the efficiency of the operation is low.

Furthermore, an opening provided on a substrate accommodating tray for inserting a substrate removal tool may allow dust and the like to enter the substrate accommodating tray during a transportation of the substrate accommodating tray. This may cause a glass substrate accommodated in the substrate accommodating tray to be contaminated.

SUMMARY OF THE INVENTION

According to one aspect of the present invention, there is provided a substrate accommodating tray pallet having a substrate in a horizontal state, including openings for inserting substrate removal tools for raising the substrate, and being used for transferring substrate accommodating trays which can be vertically stacked, wherein: the substrate accommodating trays are to be mounted on an upper surface; and substrate removal tool insertion openings for inserting the substrate removal tools are positioned so as to oppose openings of the mounted substrate accommodating trays.

In one embodiment of the present invention, the substrate removal tool insertion openings are opened/closed by shutter members.

In one embodiment of the present invention, a substrate accommodating tray pallet has substrate accommodating trays for accommodating substrates on an upper surface and for transfer the substrate accommodating trays, and the pallet comprises: vertically penetrating substrate removal tool insertion openings which allow the substrate removal tools to remove substrates accommodated in the substrate accommodating trays for removing the substrates from the substrate accommodating tray; and shutter members for opening/closing the substrate removal tool insertion openings.

In one embodiment of the present invention, a substrate accommodating tray pallet has substrate accommodating trays for accommodating substrates on an upper surface and transfers the substrate accommodating trays, the pallet comprises: a palette body including vertically penetrating pallet body openings; and shutter bodies which are located on an upper surface of the palette body, and include shutter body openings located at positions opposing the pallet body openings, wherein: the pallet body openings and the shutter body openings define substrate removal tool insertion openings for inserting substrate removal tools for removing the substrates accommodated in the substrate accommodating trays, and the shutter bodies include shutter members for opening/closing the substrate removal tool insertion openings.

In one embodiment of the present invention, the shutter members slide in a horizontal direction to open/close the substrate removal tool insertion openings.

In one embodiment of the present invention, a substrate accommodating tray pallet comprises: force applying section for applying force to the shutter members in a direction to close the substrate removal tool insertion openings; and shutter opening/closing mechanism which slides the shutter members to resist the force applying section in a direction to open the substrate removal tool insertion openings in response to an external force.

In one embodiment of the present invention, the shutter opening/closing mechanism includes wire connected to the shutter members, and operational tools for sliding the shutter members so as to open the substrate removal tool insertion openings by pulling the wire in response to an external force.

In one embodiment of the present invention, the shutter members are located above the shutter body openings and rotate in a vertical direction for opening/closing the shutter body openings.

In one embodiment of the present invention, the shutter members are supported by the substrate removal tools inserted into the substrate removal tool insertion openings and rotated upward so as to open the substrate removal tool insertion openings.

According to another aspect of the present invention, there is provided a substrate transfer system comprising the above-described substrate accommodating tray pallet, the substrate removal tools, and a moving section for moving the substrate accommodating tray pallet positions where the substrate removal tools are located, the system comprising: a pressurizing section which is in contact with the operational tools and pushes the operational tools when the moving section moves the substrate accommodating tray pallet to the position where the substrate removal tools are located, the pressurizing section pushing the operational tools such that the shutter members slide to open the substrate removal tools openings.

The surface accommodating tray pallet according to the present invention includes openings for inserting substrate removal tools for removing a substrate accommodated in a substrate accommodating tray. Thus, for removing the substrate from vertically stacked surface accommodating trays, it is not necessary to take off the substrate accommodating tray from the surface accommodating tray pallet. This improves operation efficiency for removing the substrate from the surface accommodating tray. The surface accommodating tray pallet also includes shutter members for opening/closing the openings for inserting the substrate removal tools. Thus, the substrate accommodated in the substrate accommodating tray may not be undesirably contaminated by dust during transporting or transferring the substrate accommodating tray.

Thus, the invention described herein makes possible the advantages of: (1) providing a substrate accommodating tray pallet preferably used for removing a substrate from a number of substrate accommodating trays each including one substrate in an efficient manner; (2) a substrate accommodating tray pallet which can prevent dust from entering openings of substrate accommodating trays to prevent contamination of the substrate accommodated in the substrate accommodating trays when a number of substrate accommodating trays each including one substrate are vertically stacked, and is transported or transferred; and a substrate transfer system which can remove substrates from substrate accommodating trays each including one substrate which are vertically stacked in an efficient manner.

These and other advantages of the present invention will become apparent to those skilled in the art upon reading and understanding the following detailed description with reference to the accompanying figures.

DETAILED DESCRIPTION OF THE INVENTION

Hereinafter, embodiments of the present invention will be-described with reference to figures.

A substrate accommodating tray pallet according to the present invention is used for transporting or transferring a substrate. The substrate is, for example, a display glass substrate used for a display panel of a liquid crystal display device or the like. First, a substrate accommodating tray transferred by a substrate accommodating tray pallet according to the present invention will be described.

Figure 1:
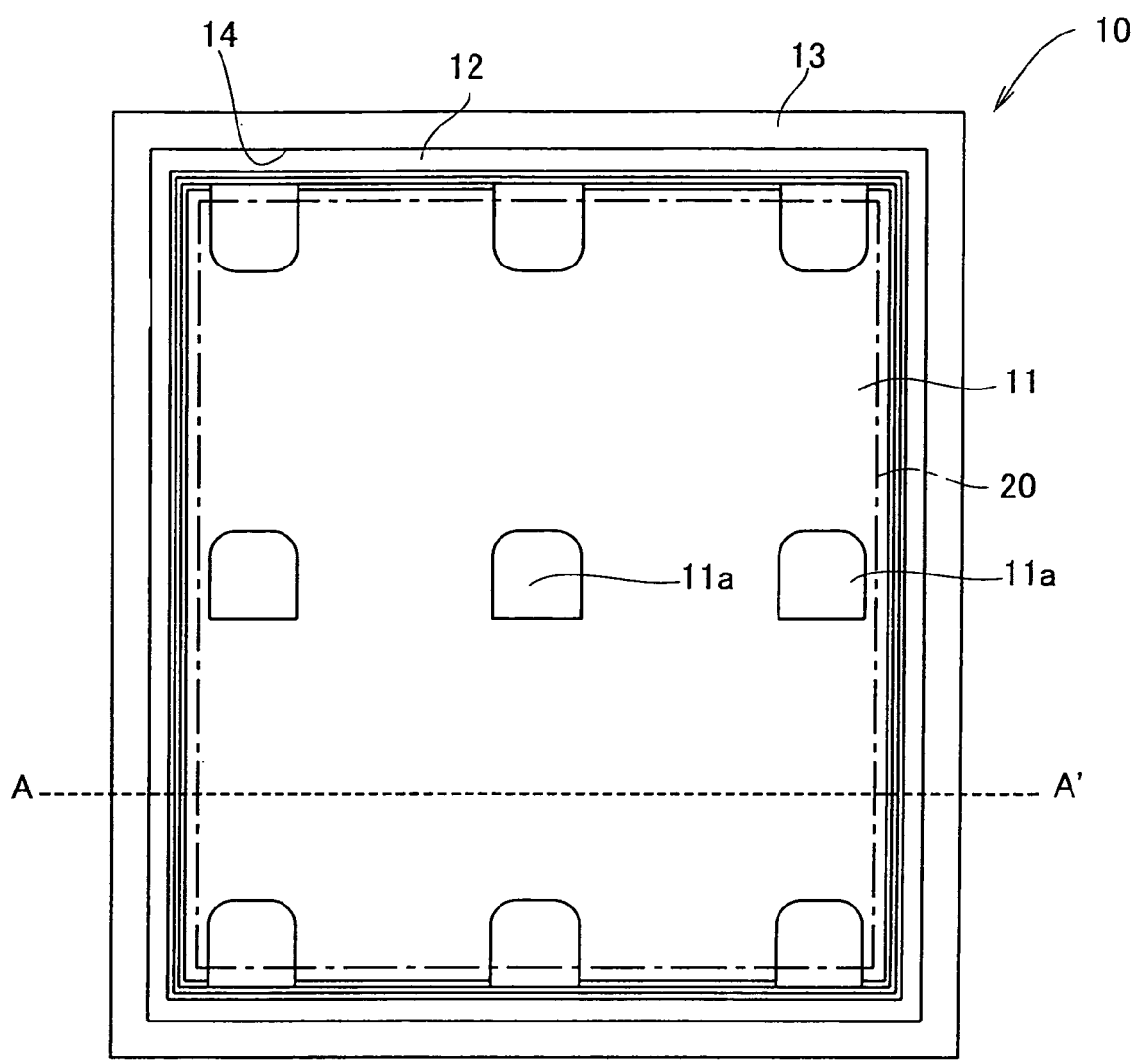
FIG. 1 is a plan view showing an example of a substrate accommodating tray usable in a substrate transfer apparatus according to the present invention.
Figure 2:
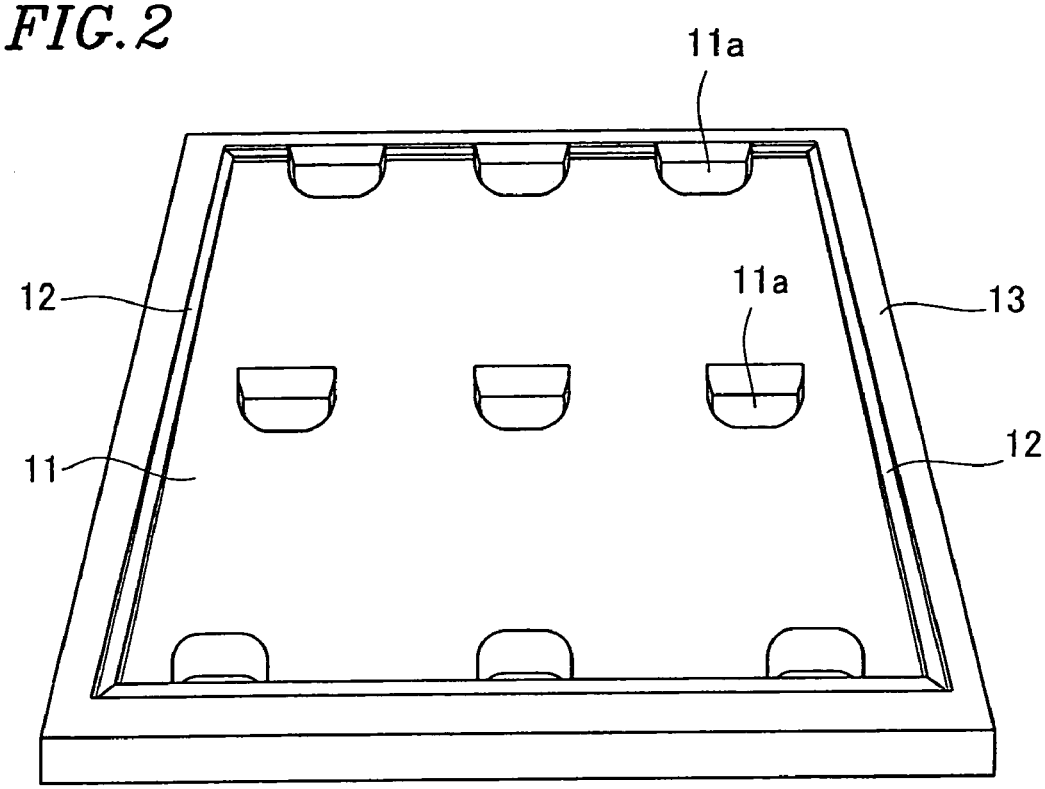
FIG. 2 is a perspective view of the substrate accommodating tray.
Figure 3:
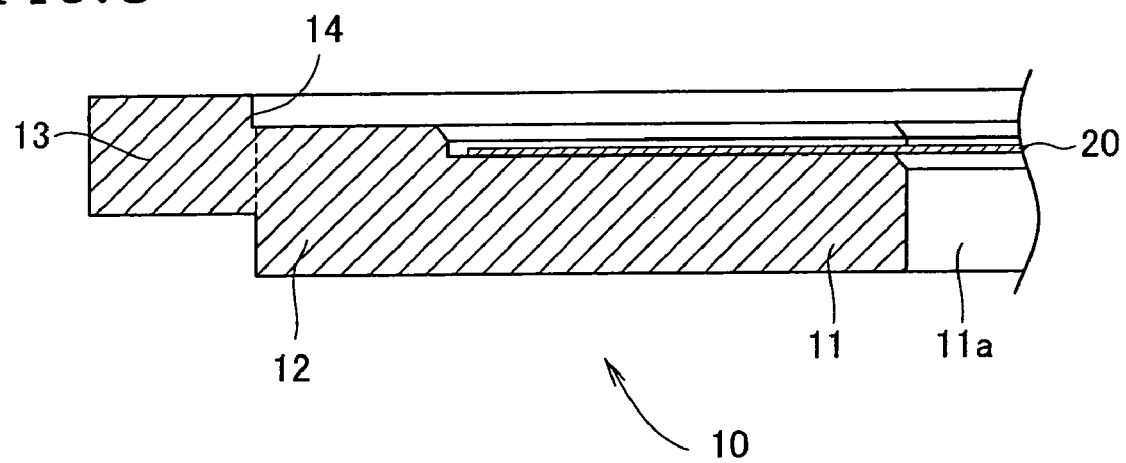
FIG. 3 is across-sectional view of the substrate accommodating tray.

FIG. 1 is a perspective view of a substrate accommodating tray 10 according to an example of the present invention; FIG. 2 is a plan view of the substrate accommodating tray 10; and FIG. 3 is a cross sectional view of substrate accommodating tray 10 taken along line A-A in FIG. 1. The substrate accommodating tray 10 is used for accommodating a glass substrate used for a liquid crystal display panel; specifically, a glass substrate having a side length of 1.3 m or greater and a thickness of 0.7 mm or less, for transportation or transfer.

The substrate accommodating tray 10 is integrally molded from a foam polyethylene resin or the like to be a thin rectangular parallelepiped. The substrate accommodating tray 10 includes a rectangular bottom section 11 for mounting thereon a glass substrate 20 in a horizontal fashion, and a frame 12 which is provided along the entire periphery of the bottom section 11 and projects upward. The bottom section 11 may be and the frame 12 are integrally molded from a foam polyethylene resin or the like, which is a synthetic resin foam material, or the like. The frame 12 may be provided along the periphery of the bottom section 11 such that the frame 12 surrounds at least a part of the glass substrate 20. The bottom section 11 may be reinforced with metal or the like.

The bottom section 11 has a rectangular shape which is slightly larger than the glass substrate 20, and has a thickness of, for example, about 15 mm. The glass substrate 20 is mounted on the top surface of the bottom section 11.

Square openings 11a are formed in the vicinity of the corners of the bottom section 11 and at intermediate positions between the corners along the four sides of the bottom section 11. A square opening 11a is also formed at the center of the bottom section 11. Thus, the bottom section 11 has nine openings 11a arranged in a 3×3 matrix. The openings 11a are provided on the bottom section 11 so that substrate removal tools can be inserted. The substrate removal tools are used for removing the glass substrate 20 mounted on the bottom section 11 from the substrate accommodating tray 10.

The frame 12 is provided along the entire periphery of the bottom section 11, and has a width of about 30 mm. The frame 12 projects to a level higher than the level of the top surface of the bottom section 11 by about 5 mm. The frame 12 surrounds the entire periphery of the glass substrate 20 mounted on the bottom section 11 at an appropriate distance in a horizontal direction from the edge of the glass substrate 20.

An engaging section 13 is provided along the entire periphery of the frame 12. The engaging section 13 projects to a level higher than a top surface of the frame 12. The engaging section 13 has a width of, for example, about 30 mm and horizontally projects outward from the frame 12. The engaging section 13 has a rectangular cross-section, and is engageable with a chuck nail for chucking. The chuck nail is used for transferring the substrate accommodating tray 10 to a prescribed position.

A top surface of the engaging section 13 is in a horizontal state outside and above the top surface of the frame 12. The frame 12 has a step portion which is provided between the top surface of the engaging section 13 and the top surface of the frame 12. The step is vertical to the top surface of the frame 12. The step forms a positioning portion 14 along the entire periphery of the frame 12.

In the substrate accommodating tray 10 having the above-described structure, the glass substrate 20 (for example, a glass substrate for a liquid crystal panel having a thickness of 0.7 mm or less) is accommodated on the top surface of the bottom section 11 which has the openings 11a. A surface of the glass substrate 20 for a liquid crystal panel which does not have electrodes or the like is in contact with the top surface of the bottom section 11. The bottom section 11 is slightly larger than the glass substrate 20 to be accommodated, and thus the glass substrate 20 is mounted on the bottom section 11 at an appropriate distance from the edge of the frame 12.

Figure 4:
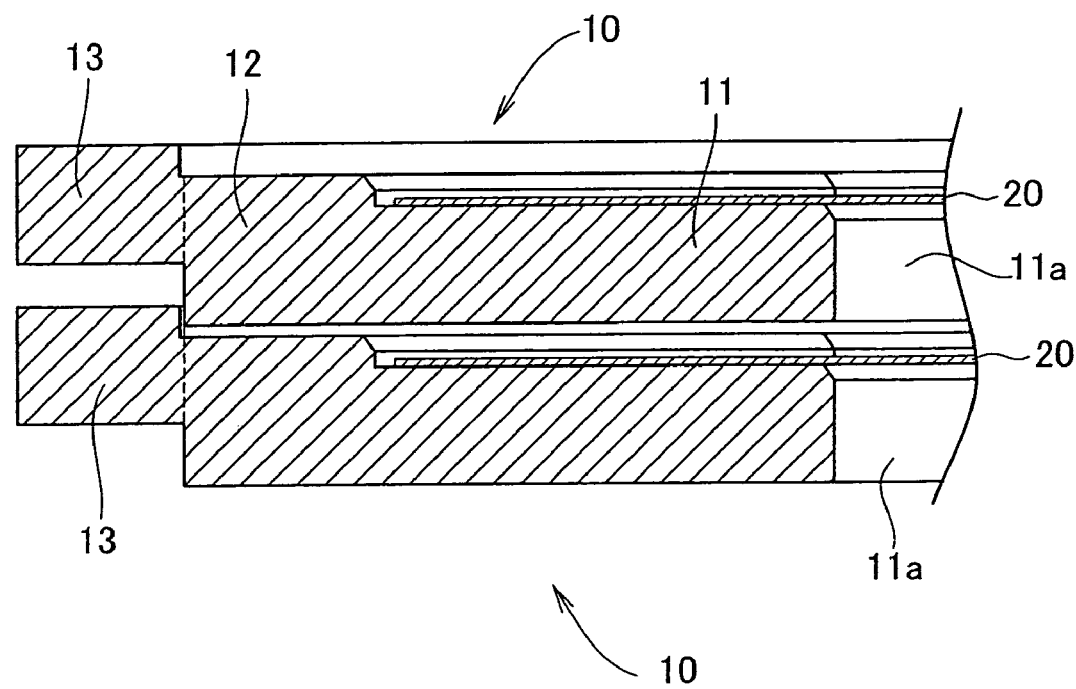
FIG. 4 is a cross-sectional view of the substrate accommodating trays vertically stacked.

As shown in FIG. 4, a plurality of substrate accommodating trays 10 each accommodating a glass substrate 20 can be stacked vertically and transported or transferred in this state. A bottom end of the bottom section 11 of the frame 12 of an upper substrate accommodating tray 10 is engaged with the positioning portion 14 of a lower substrate accommodating tray 10. The positioning portion 14 is a step between an upper surface of the engage section 13 of the lower substrate accommodating tray 10 and the upper surface of the frame 12. The substrate accommodating trays 10 stacked vertically do not slip in a horizontal direction with respect to each other.

For example, a plurality of (for example, about 60) substrate accommodating trays 10 each accommodating a glass substrate 20 can be stacked vertically and transported or transferred. The bottom end of the bottom section 11 of the uppermost substrate accommodating tray 10 is engaged with the positioning portion 14 provided on an upper end of the substrate accommodating tray 10 below. Therefore, there is an appropriate space between the engaging section 13 provided on an upper portion of the frame 12 of the uppermost substrate accommodating tray 10 and the engaging section 13 provided on an upper portion of the frame 12 of the substrate accommodating tray 10 below.

The substrate accommodating tray pallet according to the present invention is usable for transporting a substrate accommodating tray having the above-described structure.

Figure 5:
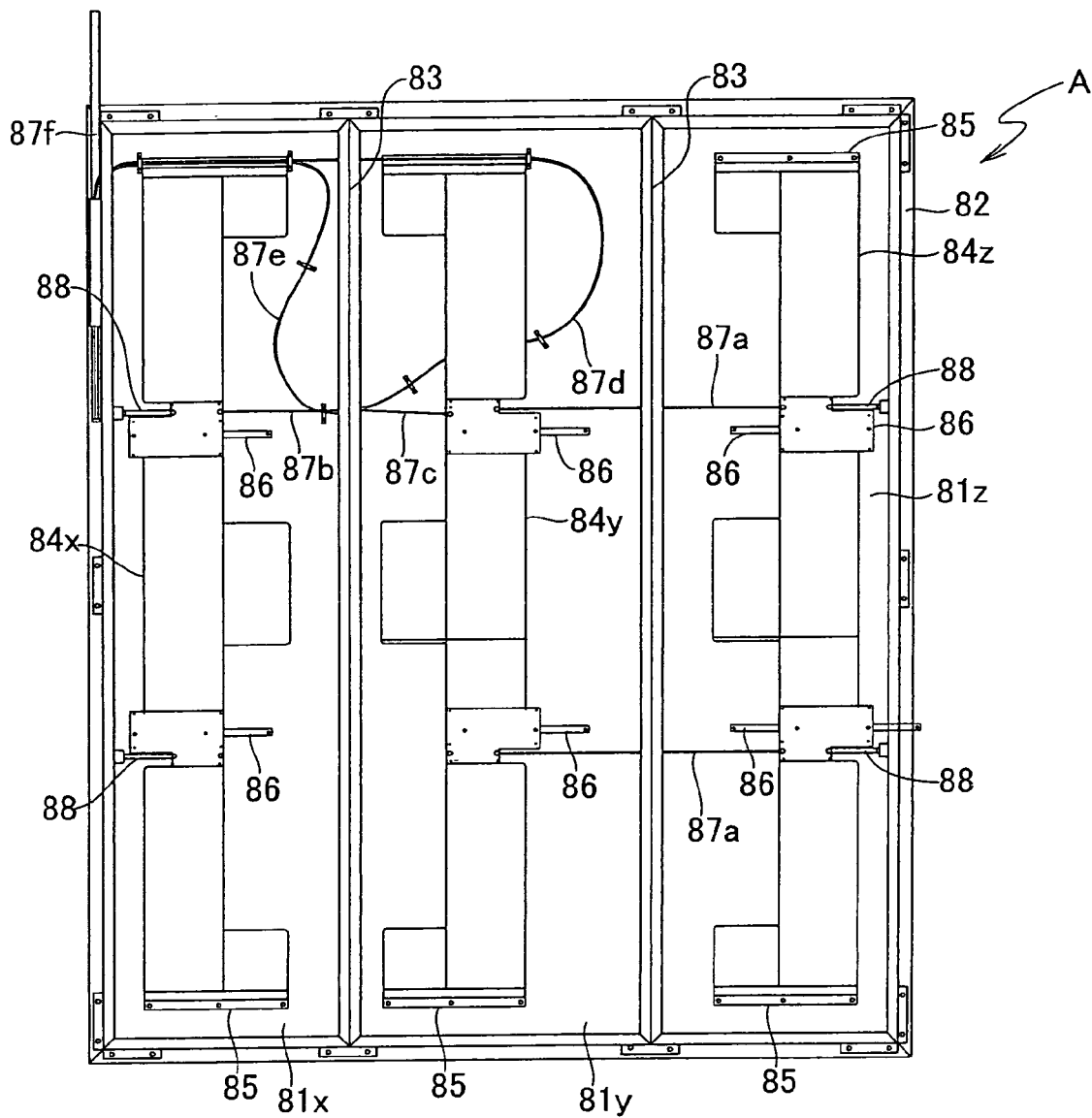
FIG. 5 is a plan view showing an example of substrate accommodating tray pallet according to one embodiment of the present invention.
Figure 6:
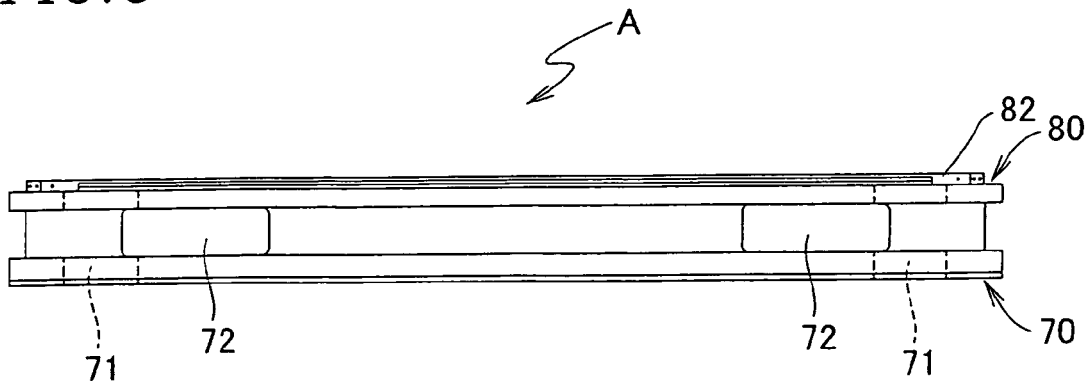
FIG. 6 is a front view of the substrate accommodating tray pallet.
Figure 7:
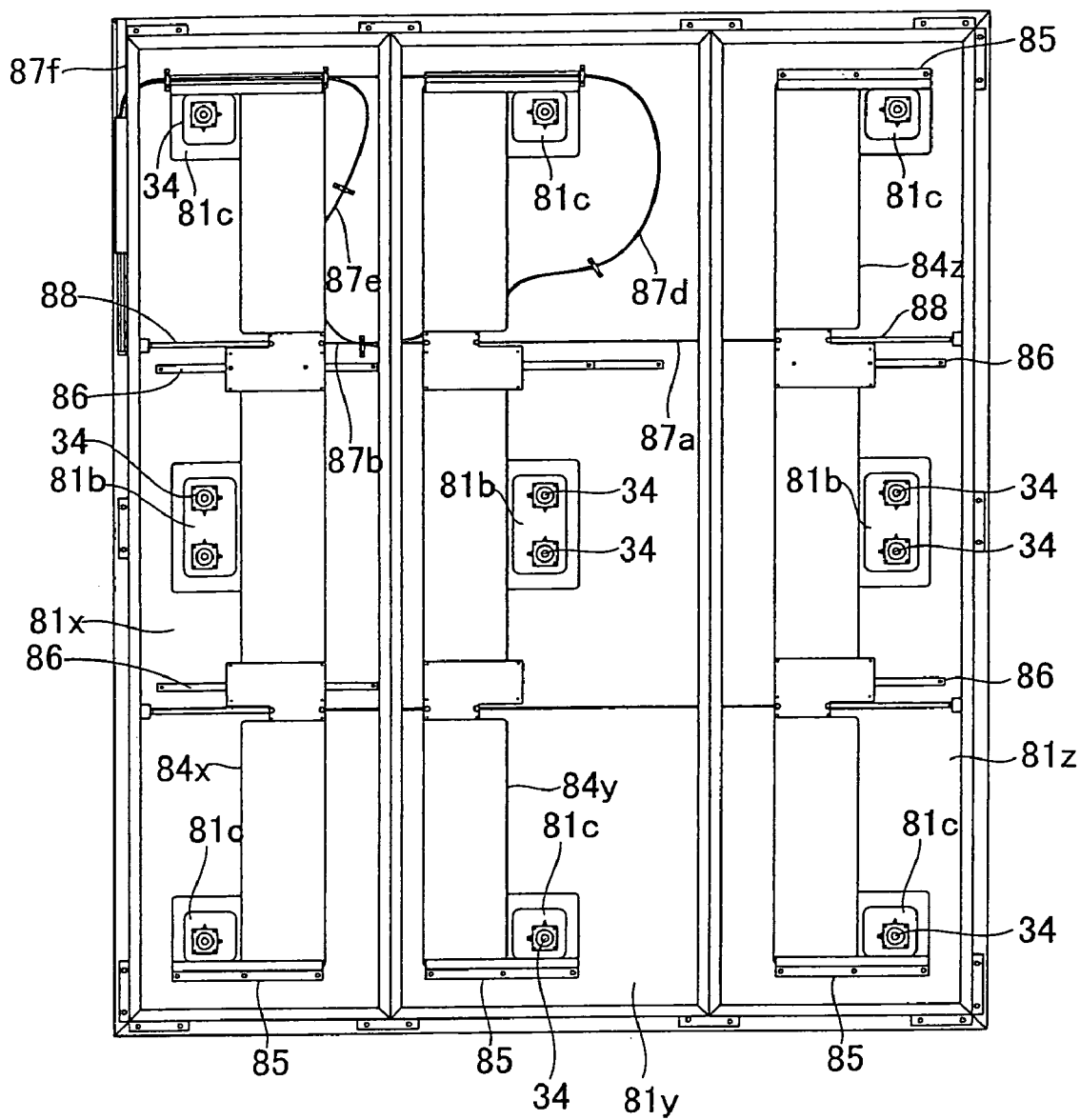
FIG. 7 is a plan view for illustrating an operation of the substrate accommodating tray pallet.

FIG. 5 is a plan view of the substrate accommodating tray pallet according to an example of the present invention. FIG. 6 is a front view thereof, and FIG. 7 is a plan view for illustrating an operation of the substrate accommodating tray pallet.

A substrate accommodating tray pallet A of the present invention includes a planar pallet body 70 and a shutter body 80 provided on the pallet body 70.

The shutter body 80 includes a frame 82. The frame 82 has a similar structure as the frame 12 provided on the substrate accommodating tray 10 described above. The bottom end of the frame 12 of the substrate accommodating tray 10 is stacked on the frame 82 with a positional relationship therebetween determined.

The frame 82 has a rectangular shape and is equally divided into three regions by a pair of reinforcing frames 83. The regions of the frame 82 divided by the reinforcing frames 83 respectively including a first, second and, third plates 81x, 81y, and 81z. The plates 81x to 81z covers the entire area of the frame 82. Peripheral portions of the plates 81x to 81z are integrally attached to the frame 82 surrounding the plates 81x to 81z and the reinforcing frame 83.

As shown in FIG. 7, the plates 81x to 81z respectively include shutter body openings 81b in intermediate positions of a longitudinal direction and shutter body openings 81c in end portions of a longitudinal direction. The shutter body openings 81b and 81c are respectively aligned to and oppose the openings 11a on the bottom portion of the substrate accommodating tray 10, when the substrate accommodating tray 10 is mounted on the shutter body 80. Three shutter body openings 81b and 81c provided on the first plate 81x and the third plate 81z positioned on both sides of the frame 82 are provided along sides of the frame 82. Three shutter body openings 81b and 81c provided on the second plate 81y positioned at the center of the frame 82 are positioned along a central portion of the second plate 81y in a width direction.

Each of the shutter body openings 81c on end portions of the plates 81x to 81z has a square shape, so that a substrate removal tool 34 (see FIG. 7) can be inserted into each of the shutter body openings 81c. The shutter body openings 81b provided in central portions of the plates 81x to 81z has a rectangular shape so that a pair of the substrate removal tools 34 can be inserted into each of the shutter body openings 81b. The longer sides of the shutter body openings 81b runs along the longitudinal direction of the plates 81x to 81z. Three shutter body openings 81b and 81c on each of the plates 81x to 81z are opened/closed respectively by a first, second and third shutter members 84x to 84z.

Each of the shutter members 84x to 84z has a rectangular shape and a length slightly shorter than that of the plates 81x to 81z so that the shutter body openings 81c on the end portions of the plates 81x to 81z can be covered by end portions of the shutter members 84x to 84z. Guide rails 85 are provided outside the openings 81c on both ends of the plates 81x to 81z along a direction orthogonal to a longitudinal direction of the shutter members 84x to 84z. Both sides of each of the shutter members 84 are respectively engaged to the guide rails 85 so as to be slidable.

The guide rails 85 provided on the first and the third plates 81x and 81z on both sides of the frame 82 respectively extend from the outer side of the shutter body openings 81c toward the second plate 81y in the central portion of the frame 82. The first and the third shutter members 84x and 84z on the plates 81x and 81z are positioned at both sides of the frame 82 to close the three shutter body openings 81b and 81c on the first and the third plates 81x and 84z. From such a position, the shutter members 84x to 84z slide along the guide rails 85 in opposite directions with respect to each other toward the central second plate 81y. Thus, three shutter body openings 81b and 81c on the first and the third plates 81x and 81z are respectively opened.

Guide rails 85 on the second plate 81y on the central portion of the frame 82 are provided in correspondence to the shutter body openings 81c on both ends of the third plate 81z, so that the second shutter member 84y on the plate 81y can slide in the same direction as the third shutter member 84z on the third plate 81z to open/close all the shutter body openings 81b and 81c.

The first to the third plates 81x to 81z include slide rails 86 at two positions for dividing the plates 81x to 81z in a longitudinal direction. The slide rails are in parallel with guide rails 85. Sliders (not shown) are attached on the bottom surfaces of the shutter members 84x to 84z on the plates 81x to 81z. The sliders are engaged to the slide rails 86 for sliding.

A pair of tension springs 88 pull the first and the third shutter members 84x and 84z on the first and the third plates 81x and 81z in a direction to close all the shutter body openings 81b and 81c. The tension springs 88 respectively bridge gaps between the shutter members 84x to 84z and the frame 82 close to the shutter members 84x to 84z, in the vicinity of the slide rails 86. The second shutter member 84y on the central second plate 81y and the shutter member 84z on the third plate 81z which slides as the same direction as the second shutter member 84y are connected by the connecting wire 87a. The second shutter member 84y and the third shutter member 84z slide in an integral manner. The central second shutter member 84y is pulled by pulling the third shutter member 84z connected by thereto by the connecting wire 87a with a pair of the tension springs 88. Thus, all the shutter body openings 81b and 81c on the central second plate 81y are closed.

The first shutter member 84x on the first plate 81x open all the shutter body openings 81b and 81c on the first plate 81x by the first pulling wire 87b. The first pulling wire 87b goes through the first sleeve 87d provided on the central second plate 81y. The first sleeve 87d extends along the outer side of the one of the guide rails 85 on the second plate 81y, the outer side of the guide rail 85 on the first plate 81x, and the longitudinal side of the frame 82 close to the first plate 81x. One end of the first pulling wire 87b goes through the first sleeve 87d which is connected to a base portion of a sliding rod 87f. The sliding rod 87f is located along the longitudinal direction of the frame 82 so as to be slidable.

One end of second pulling wire 87c is connected to the second shutter member 84y on the central second plate 81y. The second pulling wire 87a pulls the second shutter member 84y so as to open all the shutter body openings 81b and 81c on the central second plate 81. The second pulling wire 87c goes through the second sleeve 87e provided on the first plate 81x. The second sleeve 87e extends along the external side of one guide rail 85 on the first plate 81x, the same guide rail as the first sleeve 87d extends along, together with the first sleeve 87d, and along the longitudinal side of the frame 82 close to the first plate 81x together with the first sleeve 87d. One end of the second pulling wire 87c goes through the second sleeve 87 is connected to the base portion of the sliding rod 87f together with the first pulling wire 87b. The sliding rod 87e which is located along the longitudinal direction of the frame 82 so as to be slidable.

When the first shutter member 84x connected to the first pulling wire 87b closes all the shutter body openings 81b and 81c on the first plate 81x with the tension spring 88 for pulling the first shutter member 84x, and the central second shutter member 84y connected to the second pulling wire 87c closes all the shutter body openings 81b and 81c on the central second plate 81y with the tension spring 88 for pulling the third shutter member 84z, the sliding rod 87f is pulled by the first and the second pulling wire 87b and 87c and protrudes from the frame 82 along the longitudinal direction.

When an external force is applied to the sliding rod 87f, the sliding rod 87f slides along the longitudinal direction so that it is not protruded from the frame 82. Thus, the first and the second pulling wire 87b and 87c are pulled. The first shutter member 84x on the first plate 81x and the second shutter member 84y on the central second plate 81y slide so as to open all the shutter body openings 81b and 81c on the first plate 81x and the second plate 81y.

When the central second shutter member 84y is pulled by the second pulling wire 87b, the third shutter member 84z connected to the second shutter member 84y with the connecting wire 87a slides integrally with the second shutter member 84y so as to open all the shutter body openings 81b and 81c on the third plate 81z. The sliding rod 87f is an operation means for sliding the sliding members 84x to 84z. The first and the second pulling wire 87b and 87c pulled by the sliding rod 87f and the like are part of the shutter opening/closing mechanism.

The shutter body 80 is provided above the pallet body 70. The pallet body 70 includes pallet body openings 71 (see FIG. 6) corresponding to all the shutter body openings 81b and 81c on the first to the third plates 81x to 81z of the shutter body 80. The pallet body openings 71 penetrate through the pallet body 70 in a vertical direction. The above-described substrate removal tools 34 are respectively inserted to the pallet body openings 71. The pallet body openings 71 and the above-described shutter body openings 81b and 81c form openings for inserting substrate removal tools. The substrate removal tools 34 are inserted into the openings. The pallet body 70 includes side surface openings 72 on each of side surfaces. A fork of a forklift is inserted to the side surface openings 72.

The substrate accommodating tray pallet A having the structure as described above is usable for transporting or transferring a plurality of (for example, about 60) substrate accommodating trays 10 each accommodating a glass substrate 20 stacked vertically.

60 substrate accommodating trays 10 each accommodating a glass substrate 20 are stacked vertically and are mounted on the shutter body 80 of the substrate accommodating tray pallet A. The positional relationship of the lowermost substrate accommodating tray 10 is determined by the frame 82 of the shutter body 80, and do not slip in a horizontal direction with respect to each other. In such a case, all the shutter body openings 81b and 81c of the shutter body 80 of the substrate accommodating tray pallet 10 are closed by the shutter members 84x to 84z.

When 60 substrate accommodating trays 10 stacked vertically are mounted on the substrate accommodating tray pallet A, the substrate accommodating tray pallet A may be transferred to a carrier of a truck by, for example, a forklift. In such a case, since all of the shutter body openings 81b and 81c of the shutter body 80 of the substrate accommodating tray pallet 10 are closed, the opening 11a of the lowermost substrate accommodating tray 10 are covered by the shutter body 80 in substantially sealed manner. Thus, dust can be prevented from entering into the lowermost substrate accommodating tray 10 through the openings 11a.

A lid for covering opened portions on an upper surface of the substrate accommodating tray 10 in substantially sealed manner is attached to the uppermost substrate accommodating tray 10. Such a lid prevents dust from entering into the uppermost substrate accommodating tray 10 from the upper surface. The substrate accommodating trays 10 stacked vertically have the upper surfaces covered by the upper substrate accommodating tray 10 in a substantially sealed manner, and have the openings 11a covered by the lower substrate accommodating tray 10 in a substantially sealed manner. Thus, the glass substrate 20 accommodated in each of the substrate accommodating trays can be prevented from being contaminated by dust or the like.

In such a manner, vertically stacked substrate accommodating trays 10 are mounted on the substrate accommodating tray pallet A for transporting by a truck to a production plant of, for example, a liquid crystal display device.

In a production plant of a liquid crystal display device or the like, the substrate accommodating tray pallet A including the vertically stacked substrate accommodating trays 10 is carried into the production plant and is transferred to a substrate transfer system in the production plant.

Figure 8:
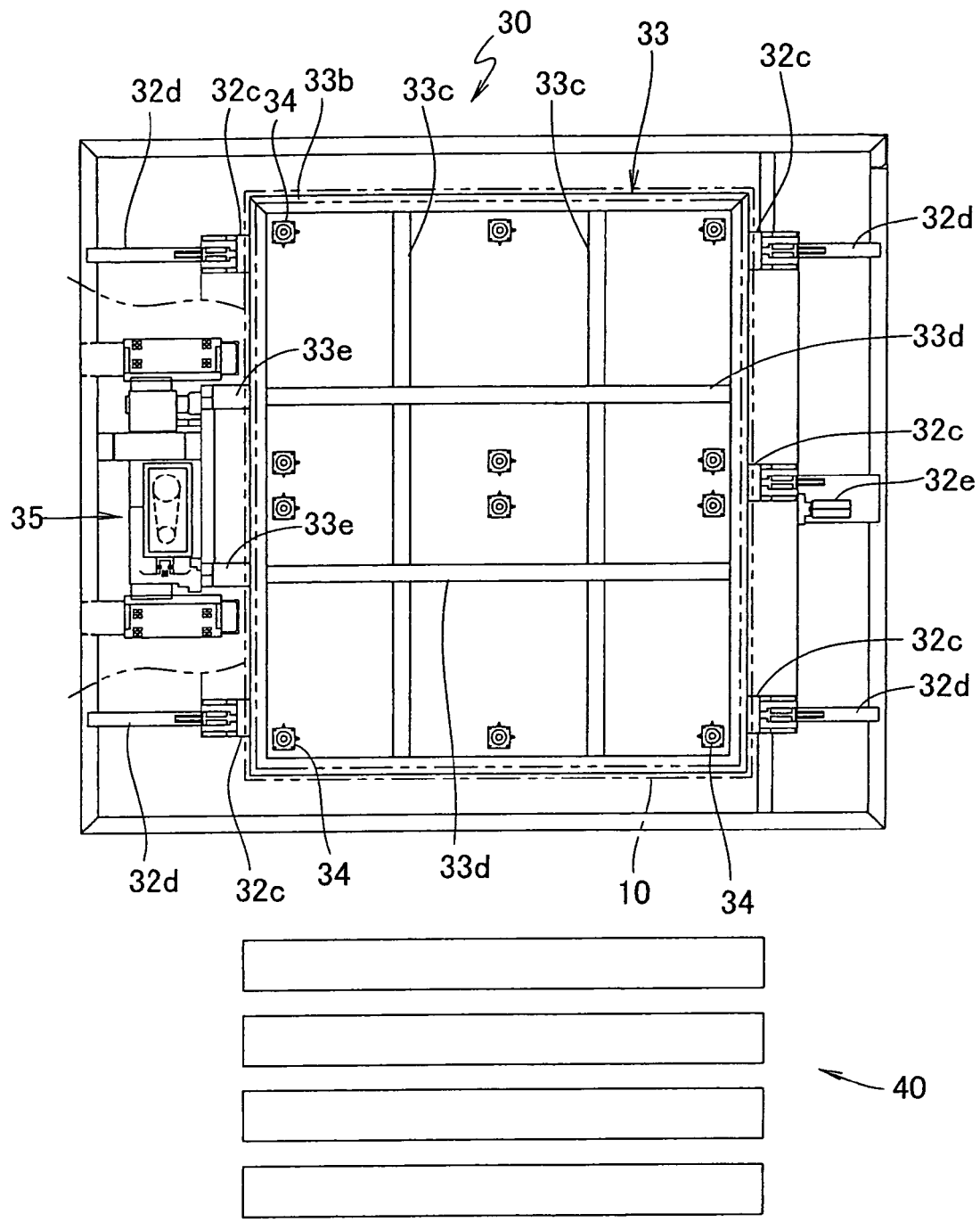
FIG. 8 is a plan view showing an example of a substrate transfer system according to the present invention.
Figure 9:
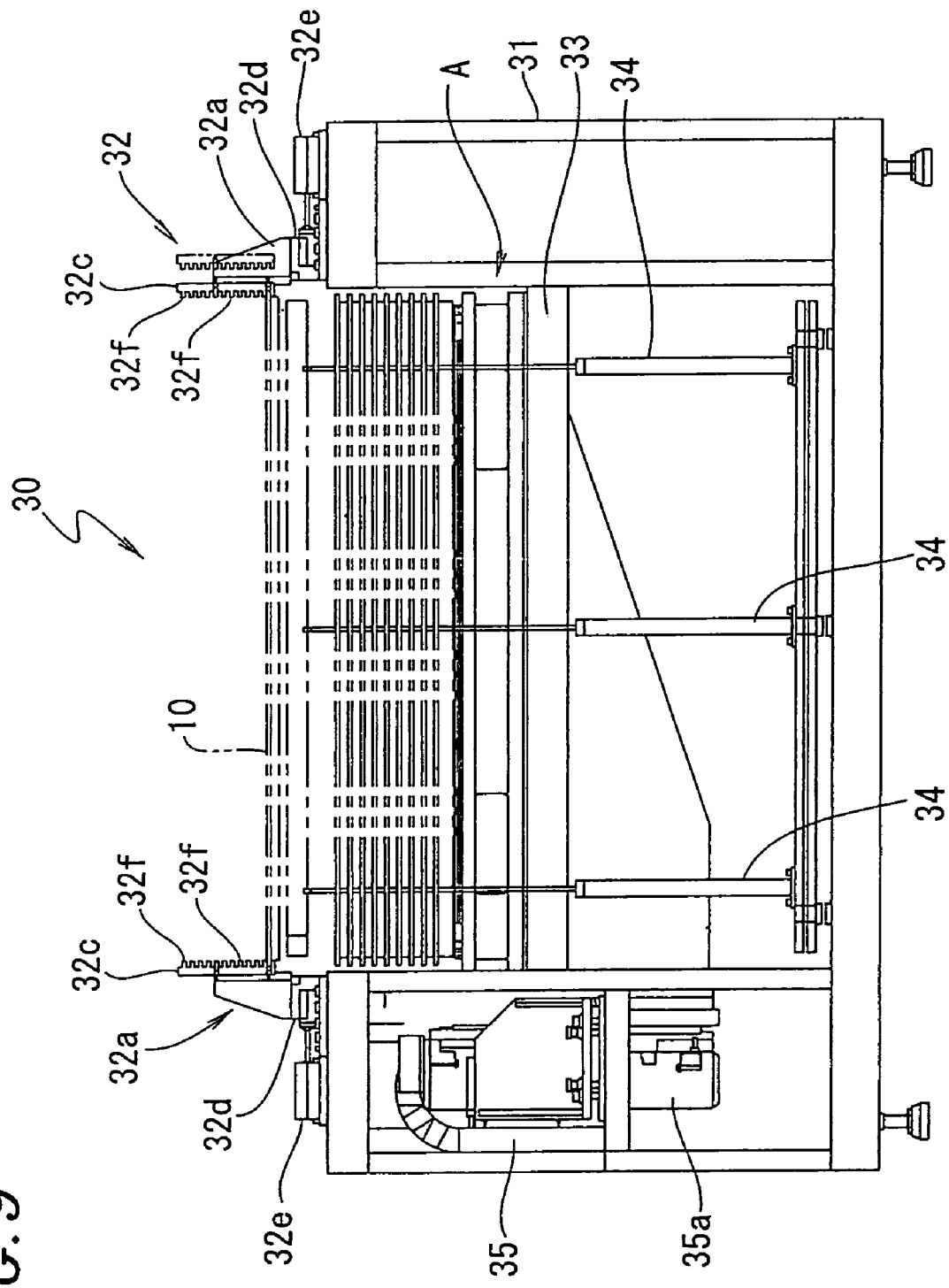
FIG. 9 is a front view of the substrate transfer system.
Figure 10:
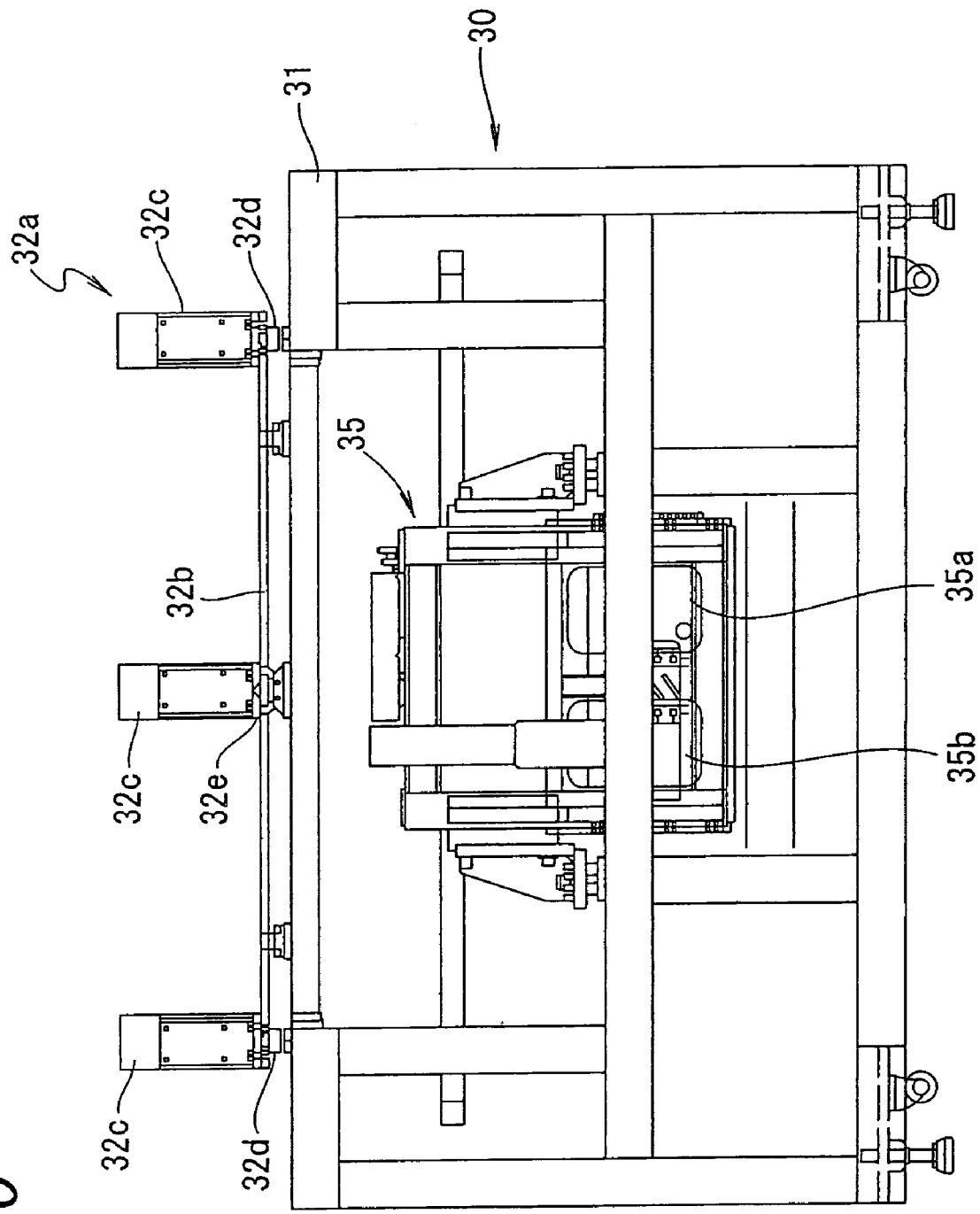
FIG. 10 is a side view of the substrate transfer system.

FIG. 8 is a schematic plan view showing the structure of the substrate transfer system, and FIG. 9 is a front view thereof. The substrate transfer system 30 includes a supporting base 31. In the supporting base 31, 12 substrate removal tools 34 each having a pin shape are located vertically. An elevatable table 33 is provided in a horizontal state in the supporting base 31 such that it can be moved up and down. The substrate accommodating tray pallet A including the vertically stacked substrate accommodating trays 10 is mounted to the elevatable table 33. The substrate removal tools 34 can penetrate the elevatable table 33 in a vertical direction.

On the supporting base 31, a tray holding unit 32 is provided. The tray holding unit 32 holds a plurality of the vertically stacked substrate accommodating trays 10 on the substrate accommodating tray pallet A mounted on the elevatable table 33.

On the side of the supporting base 31 a roller conveyer 40 is provided. The roller conveyer 40 moves the substrate accommodating tray pallet A including the vertically stacked substrate accommodating trays 10 to the elevatable table 33 in the supporting base 31. A transfer region of the roller conveyer 40 is at the same level as an upper surface of the elevatable table 33 moved upward above the substrate removal tools 34.

The elevatable table 33 includes a pressurizing plate 38. The pressurizing plate 38 abuts the sliding rod 87f of the substrate accommodating tray pallet A including the vertically stacked substrate accommodating trays 10, which is carried to the elevatable table 33, and presses the sliding rod 87f. The pressurizing plate 38 is positioned on a side opposite to the roller conveyer 40. When the substrate accommodating tray pallet A is carried to the elevatable table 33, the sliding rod 87f of the substrate accommodating tray pallet A is pressed by the pressurizing plate 38, and slides to a position such that it does not protrude from the frame member 82 of the substrate accommodating tray pallet A. Thus, the shutter members 84x to 84z of the shutter body 80 of the substrate accommodating tray pallet A slides so as to open all the shutter body openings 81b and 81c.

The tray holding unit 32 includes a pair of tray side holding sections 32a facing each other. The tray side holding sections 32a are provided for holding opposing sides of the substrate accommodating trays 10 stacked vertically.

Each tray side holding section 32a includes a lengthy plate-like support 32b provided horizontally along the respective side of the substrate accommodating trays 10, and three tray side engaging members 32c provided on the support 32b at an equal interval. The support 32b is slidable along a pair of slide guides 32d provided on an upper surface of the supporting base 31 such that the support 32b moves closer to or farther from the substrate accommodating trays 10 received by the tray holding unit 32. Such a movement of the support 32b is driven by a hydraulic cylinder 32e provided on the upper surface of the supporting base 31 respectively for each of the tray side engaging members 32c.

The three tray side engaging members 32c provided on one support 32b and the three tray side engaging members 32c provided on the other support 32b respectively face each other. On a surface of each tray side engaging member 32c facing the opposite tray side engaging member 32c, a plurality of engaging claws 32f are provided. The plurality of engaging claws 32f are arranged vertically, and respectively to be engaged with the engaging sections 13 of the plurality of substrate accommodating trays 10 stacked vertically.

The hydraulic cylinders 32e of one tray holding section 32a are driven in synchronization with the hydraulic cylinders 32e of the other tray holding section 32a. Thus, the pair of supports 32b move closer to or farther from the substrate accommodating trays 10 in synchronization with each other. The tray side engaging members 32c, which are provided on the pair of supports 32b, also move closer to or farther from the substrate accommodating trays 10 in synchronization with each other. When the tray side engaging members 32c approach the substrate accommodating trays 10, the engaging claws 32f provided on the tray side engaging members 32c are engaged with the engaging sections 13 of the substrate accommodating trays 10. By this engagement, the substrate accommodating trays 10 are held horizontally.

The elevatable table 33 which is provided in the supporting base 31 includes a rectangular frame 33b, and a pair of bars 33c and a pair of bars 33d arranged in a lattice. The pair of bars 33c extend substantially parallel to the supports 32b, and the pair of bars 33d cross the pair of bars 33c substantially perpendicularly thereto. The bars 33d are supported by a supporting arm 33e at both ends thereof. The supporting arms 33e are connected to an elevating unit 35.

Inside the supporting base 31, a plurality of (twelve in this example) substrate removal tools 34 are arranged in correspondence with the openings for inserting all the substrate removal tools of the substrate accommodating tray pallet A. Each substrate removal tool 34 is provided vertically so as to go through the openings 11a of the substrate accommodating trays 10 on the substrate accommodating tray pallet A mounted on the elevatable table 33.

The elevating unit 35 is provided for raising and lowering the elevatable table 33. The elevating unit 35 uses an elevating section 33f for integrally raising and lowering the plurality of supporting arms 33e of the elevatable table 33. The elevating section 33f includes a ball screw mechanism. Specifically, the elevating unit 35 uses an elevating section 33f for integrally raising and lowering the plurality of supporting arms 33e of the elevatable table 33. The ball screw mechanism is of a usual type; namely, includes a ball screw and a slide block engaged with the ball screw. When the ball screw rotates forward, the elevatable table 33 moves up; and when the ball screw rotates in reverse, the elevatable table 33 moves down. The elevating unit 35 includes a driving motor 35a and a decelerator 35*b*. The rotation of the driving motor 35*a* is conveyed to the ball screw mechanism via the decelerator 35*b*.

An operation of the substrate transfer system 30 having the above-described structure is as follows. The elevatable table 33 in the supporting base 31 is moved up to the uppermost position. All the substrate removal tools 34 are located below the elevatable table 33. This is a state for carrying a pallet. At this point, the supports 32*b* of the tray holding sections 32*a* are located so as not to be in contact with each other. The three tray side engaging members 32*c* on each of the supports 32*b* are also located so as not to be in contact with each other. Then, the substrate accommodating tray pallet A including the substrate accommodating trays 10 stacked vertically is transferred over the roller conveyer 40. The substrate accommodating tray pallet A is located on the roller conveyer 40 such that the sliding rod 87*f* is positioned downstream in a direction of transfer by the roller conveyer 40, and is transferred. The substrate accommodating-tray pallet A to be transferred by the roller conveyer 40 is mounted on the elevatable table 33 on the supporting base 31.

When the substrate accommodating tray pallet A is mounted on the elevatable table 33, the sliding rod 87*f* of the substrate accommodating tray pallet A abuts the pressurizing plate 38 located on the opposite side to the roller conveyer 40. The sliding rod 87*f* is pushed by the pressurizing plate 38, and slides so that it is not protruded from the substrate accommodating tray pallet A. The first and the second pulling wire 87*b* and 87*c* attached to the sliding rod 87*f* are integrally pulled. Thus, the first to the third shutter plates 84*x* to 84*z* on the shutter body 80 of the substrate accommodating tray pallet A open all the shutter body openings 81*b* and 81*c* of the first to the third plates 81*x* to 81*z*.

Figure 11:
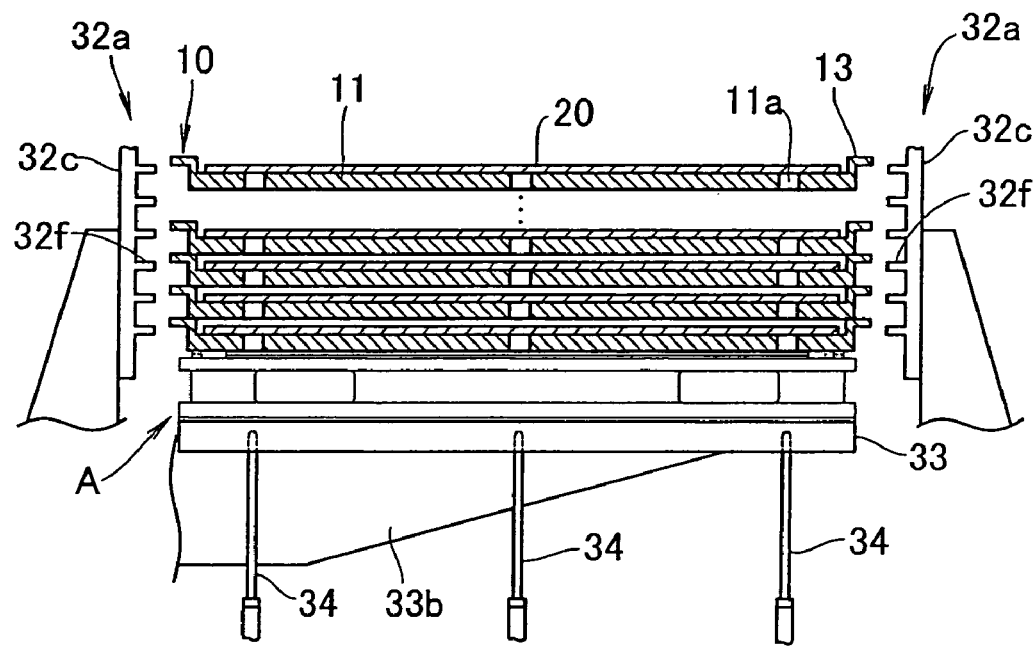
FIG. 11 is a schematic diagram for illustrating an operation of the substrate transfer system.

When all the shutter body openings 81*b* and 81*c* on the shutter body 80 of the substrate accommodating tray pallet A are open, as shown in FIG. 11, the height of the elevatable table 33 is adjusted such that the substrate accommodating trays 10 are engaged with the engaging claws 32*f* provided on the tray side engaging members 32*c*, except for the lowest substrate accommodating tray 10. In other words, the lowest substrate accommodating tray 10 is not engaged with the engaging claws 32*f*. When the height of the elevatable table 33 is thus adjusted, the hydraulic cylinders 32*e* on the upper surface of the supporting base 31 are driven in synchronization with each other, such that the three tray side engaging members 32*c* on each of the tray holding sections 32*a* move closer to each other.

Figure 12:
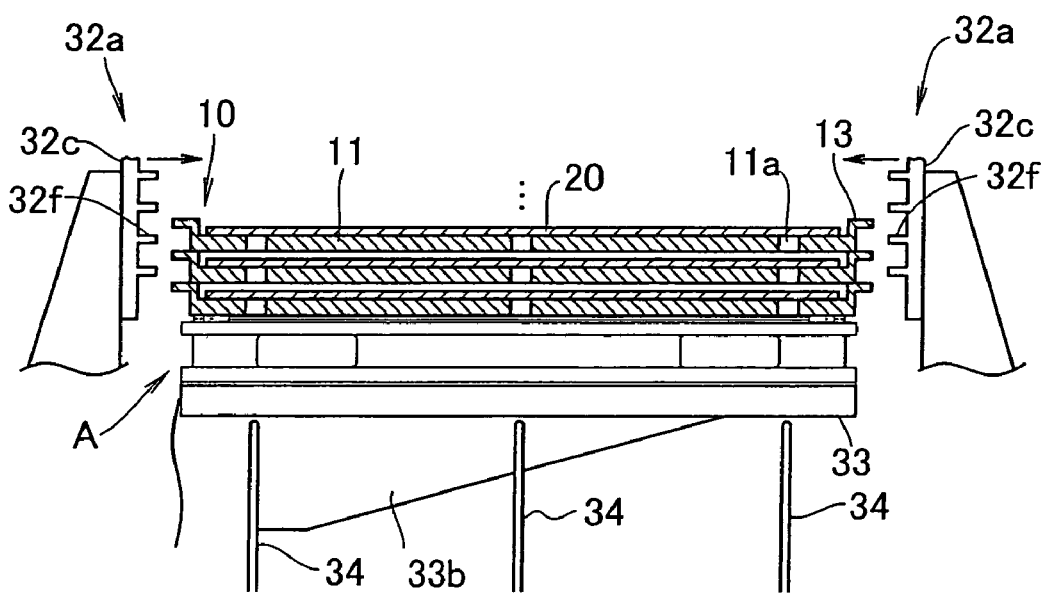
FIG. 12 is a schematic diagram for illustrating an operation of the substrate transfer system.

Thus, as shown in FIG. 12, the substrate accommodating trays 10 are engaged with the engaging claws 32*f* through the engaging sections, except for the lowest substrate accommodating tray 10. The substrate accommodating trays 10, except for the lowest substrate accommodating tray 10, are held by the tray holding unit 32. The lowest substrate accommodating tray 10 remains on the substrate accommodating tray pallet A on the elevatable table 33 without being held by the tray holding unit 32.

Figure 13:
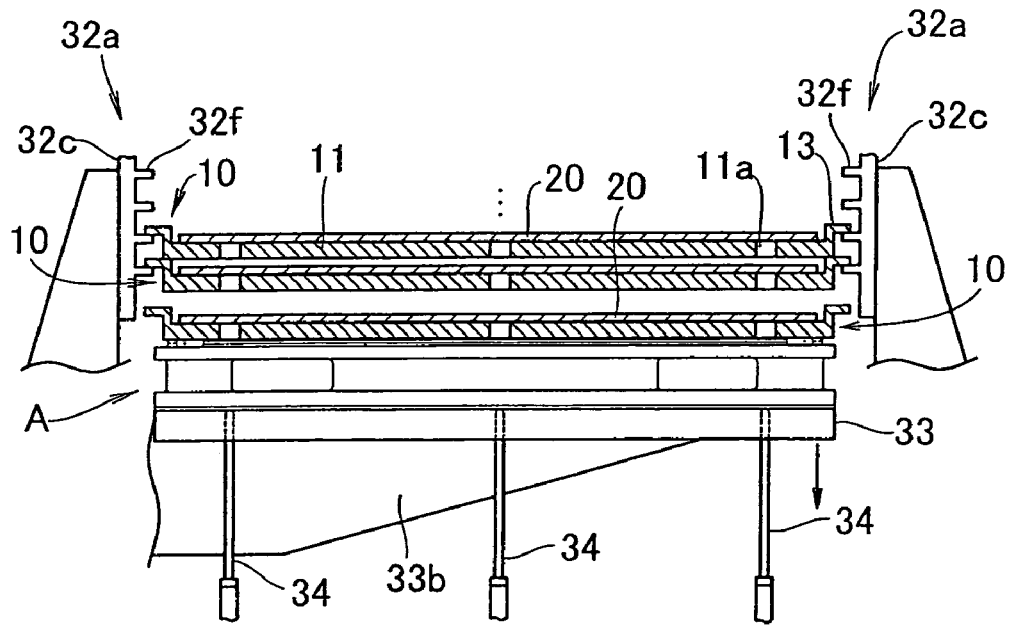
FIG. 13 is a schematic diagram for illustrating an operation of the substrate transfer system.

Then, as shown in FIG. 13, the elevatable table 33 is moved down by the elevating unit 35. The substrate accommodating tray pallet A mounted on the elevatable table 33 and the lowest substrate accommodating tray 10 are also moved down. While the elevatable table 33 is moved down, the substrate removal tools 34 provided inside the supporting base 31 go through the elevatable table 33 and the openings for insertion of the substrate removal tools of the substrate accommodating tray pallet A mounted on the elevatable table 33, which are opened, and are inserted into the openings 11*a* of the bottom section 11 of the lowest substrate accommodating tray 10.

Figure 14:
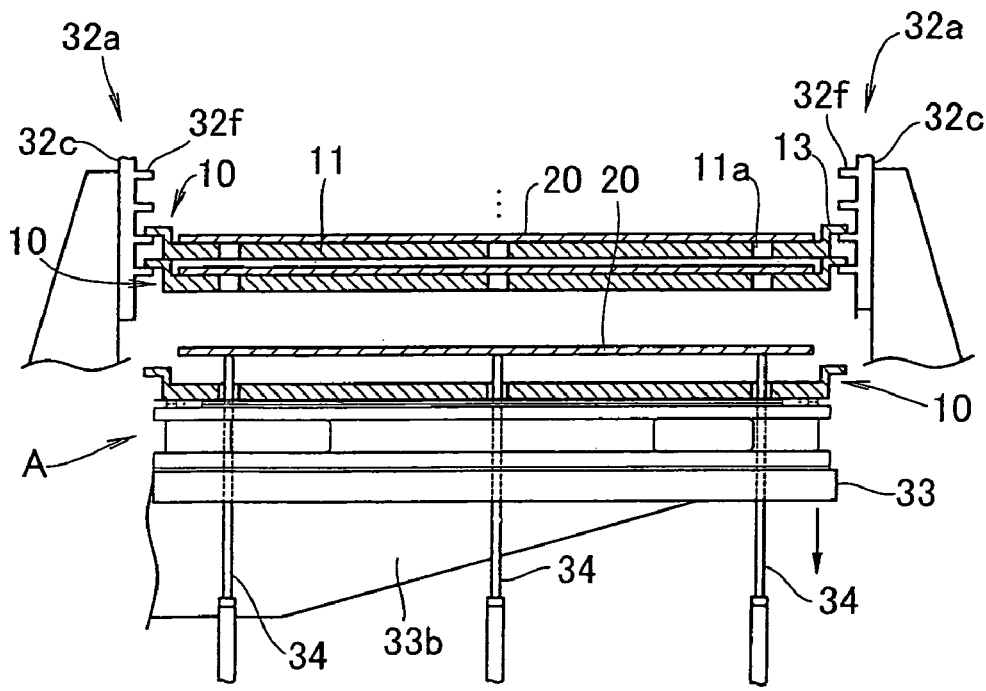
FIG. 14 is a schematic diagram for illustrating an operation of the substrate transfer system.

When the elevatable table 33 is moved further down, as shown in FIG. 14, the top end of each substrate removal tool 34 contacts a bottom surface of the glass substrate 20 accommodated in the lowest substrate accommodating tray 10 mounted on the substrate accommodating tray pallet A on the elevatable table 33. Then, the glass substrate 20 is raised relative to the lowest substrate accommodating tray 10 while being supported by the substrate removal tools 34. Namely, the top end of each substrate removal tool 34 is above the lowest substrate accommodating tray 10. (The substrate removal tools 34 are moved up relative to the substrate accommodating tray 10.) The glass substrate 20, when completely raised above the lowest substrate accommodating tray 10, is held horizontally at a prescribed height while still supported by the substrate removal tools 34.

When the glass substrate 20 is put into this state, the elevatable table 33 is stopped. Then, the glass substrate 20 is released from the substrate removal tools 34 and transferred to a prescribed position by a transfer member.

As the transfer member, for example, an adsorption hand as described in Japanese Laid-Open Publication No. 2001-93969 is used. The adsorption hand includes a pair of adsorption pads provided parallel to each other at the same height. Each adsorption pad is a flat plate-like shape and has a thickness of about 20 mm. The adsorption pad can vacuum-adsorb the bottom surface of the glass substrate 20. The adsorption hand operates as follows. Each adsorption pad is inserted into a position below the glass substrate 20, which is raised and held in a horizontal state by the substrate removal tools 34; and is slid upward. The glass substrate 20, when thus is placed on the adsorption hand, is vacuum-adsorbed to the adsorption hand. Then, the glass substrate 20 is transferred to the prescribed position.

Figure 15:
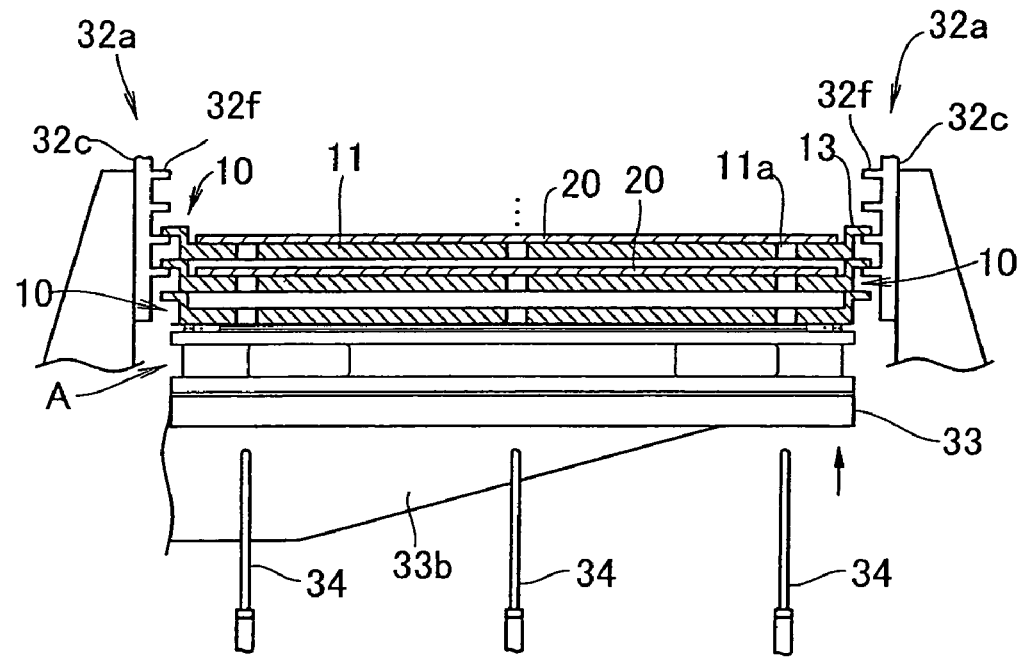
FIG. 15 is a schematic diagram for illustrating an operation of the substrate transfer system.

When the glass substrate 20 held by the substrate removal tools 34 is removed as described above, the elevatable table 33 is moved up by the elevating unit 35. Thus, the lowest substrate accommodating tray 10, from which the glass substrate 20 has been removed, is mounted on the substrate accommodating tray pallet A and moves up together with the elevatable table 33. As shown in FIG. 15, the lowest substrate accommodating tray 10 contacts the second lowest substrate accommodating tray 10 (i.e., the lowest substrate accommodating tray 10 among the plurality of substrate accommodating trays 10 held by the tray holding unit 32). Then, the upward movement of the elevatable table 33 is stopped.

Figure 16:
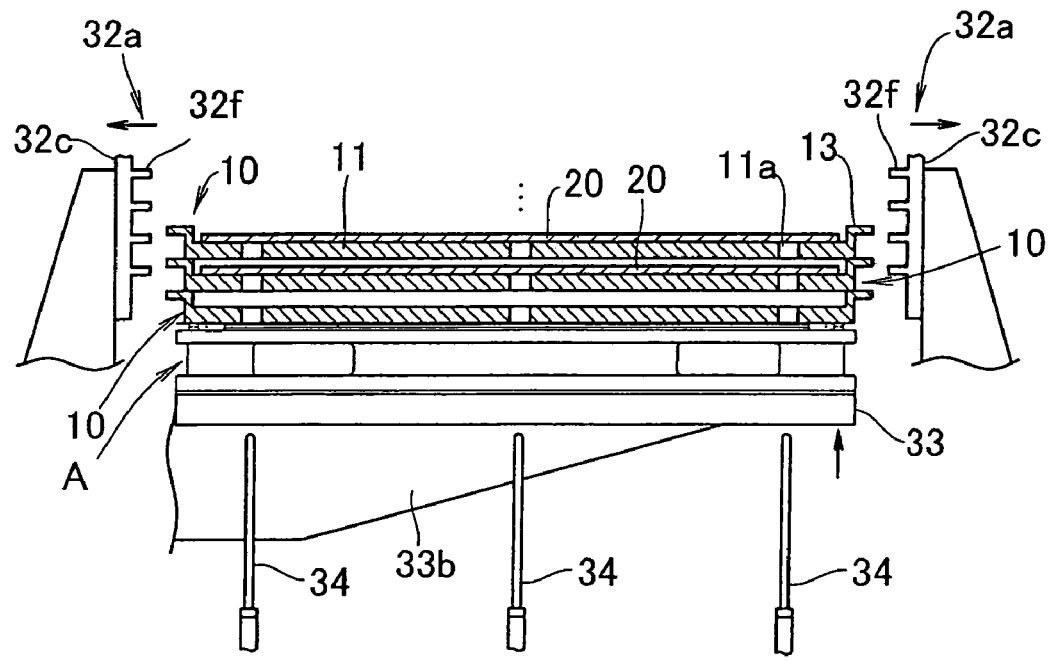
FIG. 16 is a schematic diagram for illustrating an operation of the substrate transfer system.

As shown in FIG. 16, the supports 32*b* are driven by the hydraulic cylinders 33*e* to move farther from each other. Thus, the engaging sections 13 of the vertically stacked substrate accommodating trays 10 are released from the engagement with the tray side engaging members 32*c* of the tray holding sections 32*a*, and rests on the substrate accommodating tray 10 which is mounted on the substrate accommodating tray pallet A of the elevatable table 33. The lowest substrate accommodating tray 10 does not accommodate a glass substrate 20. A prescribed number of the vertically stacked substrate accommodating trays 10 rest on the substrate accommodating tray pallet A of the elevatable table 33.

Figure 17:
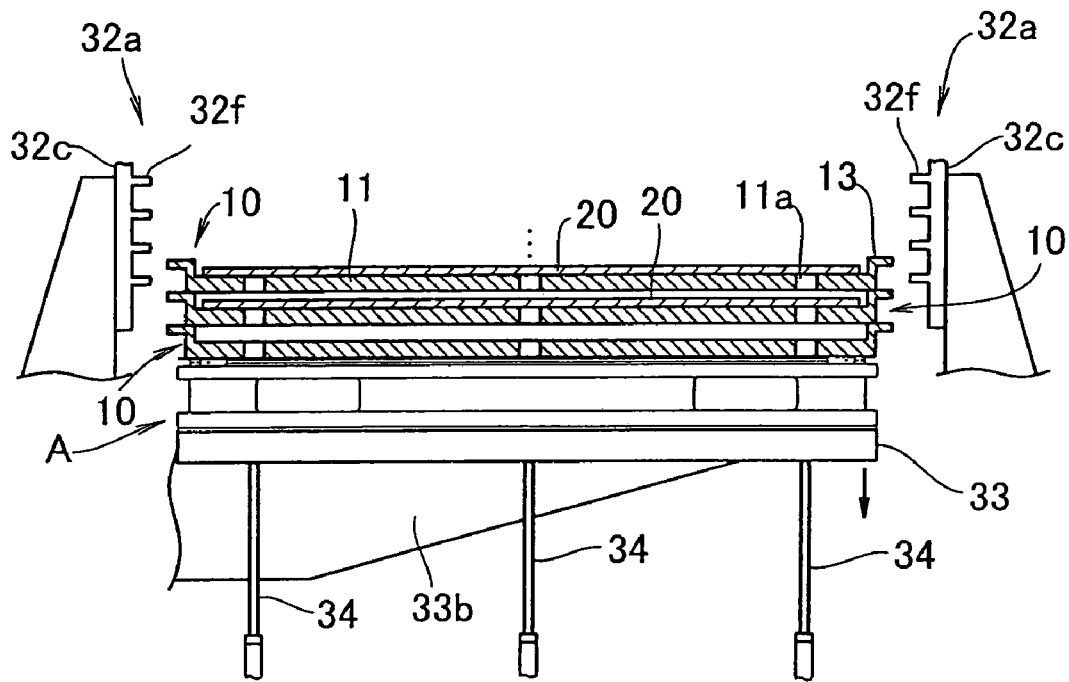
FIG. 17 is a schematic diagram for illustrating an operation of the substrate transfer system.

As shown in FIG. 17, the elevatable table 33 is moved down by a distance corresponding to one substrate accommodating tray 10. The height of the elevatable table 33 is adjusted such that the substrate accommodating trays 10 are engaged with the engaging claws 32*f*, except for the lowest substrate accommodating tray 10 with no glass substrate 20 and the second lowest substrate accommodating tray 10 (i.e., the owest substrate accommodating tray 10 among the plurality of substrate accommodating trays 10 each accommodating a glass substrate 20). When the height of the elevatable table 33 is thus adjusted, the hydraulic cylinders 32*e* are driven in synchronization with each other, such that the tray holding sections 32*a* move closer to each other.

Figure 18:
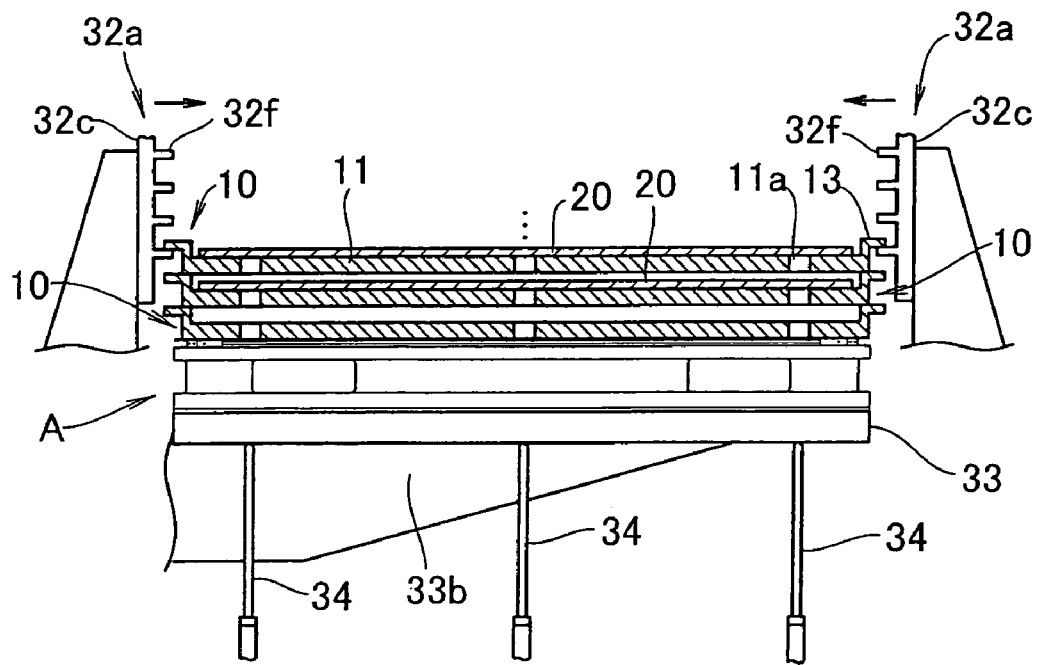
FIG. 18 is a schematic diagram for illustrating an operation of the substrate transfer system.

Thus, as shown in FIG. 18, the substrate accommodating trays 10 are engaged with the corresponding engaging claws 32f of the tree tray side engaging members 32c provided on each of the tray holding sections 32a, except for the lowest substrate accommodating tray 10 with no glass substrate 20 and the second lowest substrate accommodating tray 10. The substrate accommodating trays 10, except for the lowest and the second lowest substrate accommodating trays 10, are held by the tray holding unit 32. The lowest and the second lowest substrate accommodating trays 10 remain on the substrate accommodating tray pallet A on the elevatable table 33 without being held by the tray holding unit 32.

Then, the elevatable table 33 is moved down by the elevating unit 35. The lowest and the second lowest substrate accommodating trays 10 on the substrate accommodating tray pallet A on the elevatable table 33 are also moved down. While the elevatable table 33 is moved down, the substrate removal tools 34 provided inside the supporting base 31 go through the elevatable table 33 and the substrate accommodating tray pallet A, and are inserted into the openings 11a of the lowest and the second lowest substrate accommodating trays 10 sequentially.

Figure 19:
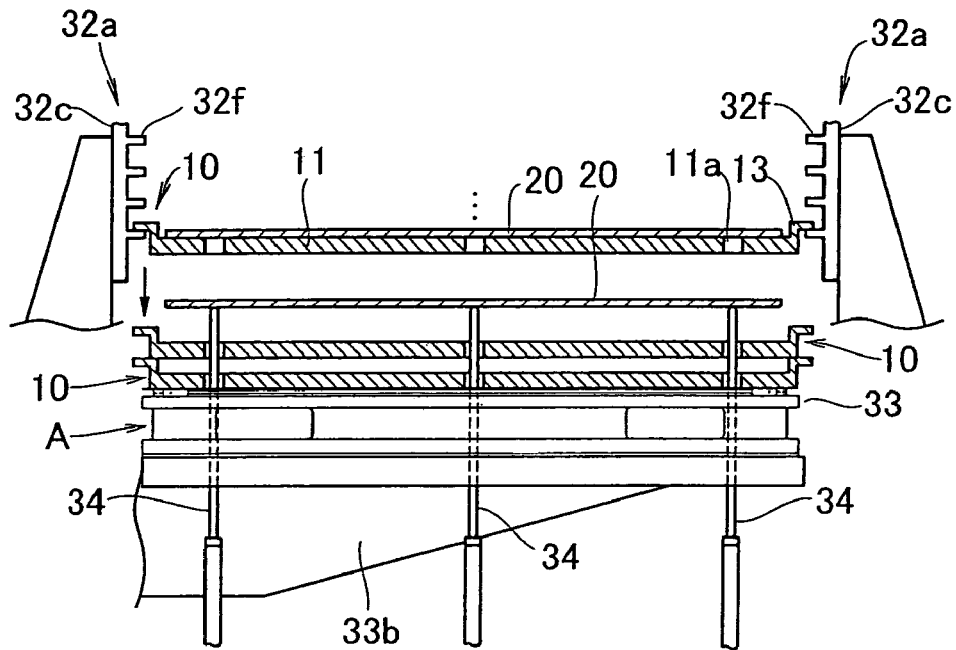
FIG. 19 is a schematic diagram for illustrating an operation of the substrate transfer system.

When the elevatable table 33 is moved further down, as shown in FIG. 19, the top end of each substrate removal tool 34 contacts a bottom surface of the glass substrate 20 accommodated in the second lowest substrate accommodating tray 10. Then, the glass substrate 20 is raised relative to the second lowest substrate accommodating tray 10 while being supported by the substrate removal tools 34. The glass substrate 20, when completely raised above the second lowest substrate accommodating tray 10, is held horizontally at a prescribed height while still supported by the substrate removal tools 34.

When the glass substrate 20 is put into this state, the elevatable table 33 is stopped. Then, the glass substrate 20 is released from the substrate removal tools 34 and transferred to a prescribed position by a transfer member such as, for example, an adsorption hand.

When the glass substrate 20 is removed as described above, the lowest and the second lowest substrate accommodating trays 10, from which the glass substrates 20 have been removed, remain on the substrate accommodating tray pallet A on the elevatable table 33.

By repeating the above-described operation, the lowest substrate accommodating tray 10 held by the tray holding unit 32 is placed on the substrate accommodating trays 10 sequentially on the substrate accommodating tray pallet A on the elevatable table 33. By the elevatable table 33 moving down, the glass substrate 20 accommodated in the substrate accommodating tray 10 placed on the table section 33a is removed from the substrate accommodating tray 10 while supported horizontally by the substrate removal tools 34. The removed glass substrate 20 is then transferred.

Figure 20:
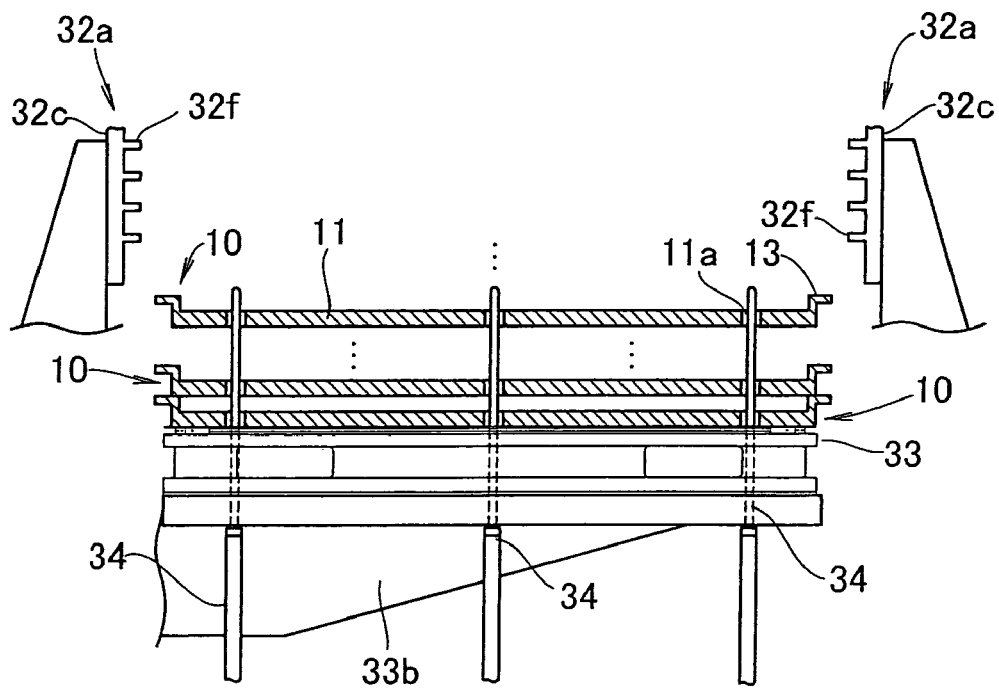
FIG. 20 is a schematic diagram for illustrating an operation of the substrate transfer system.

As a result, as shown in FIG. 20, the plurality of substrate accommodating trays 10 with no glass substrate 20 remain on the substrate accommodating tray pallet A on the elevatable table 33. These substrate accommodating trays 10 stacked vertically are transferred from the substrate accommodating tray pallet A on the elevatable table 33.

As described above, the substrate transfer system 30 according to the present invention can remove, with high efficiency, the glass substrates 20 from the substrate accommodating trays 10 stacked vertically. Since the substrate accommodating trays 10 are moved up and down to remove the glass substrates 20 therefrom, the planar size of the substrate transfer apparatus 30 is relatively small and the structure of the substrate transfer apparatus 30 is relatively simple.

The substrate transfer system 30 is also used for placing a glass substrate 20 in each of a plurality of substrate accommodating trays 10 stacked vertically. For this purpose, the substrate transfer system 30 operates oppositely to the above-described process.

Figure 21:
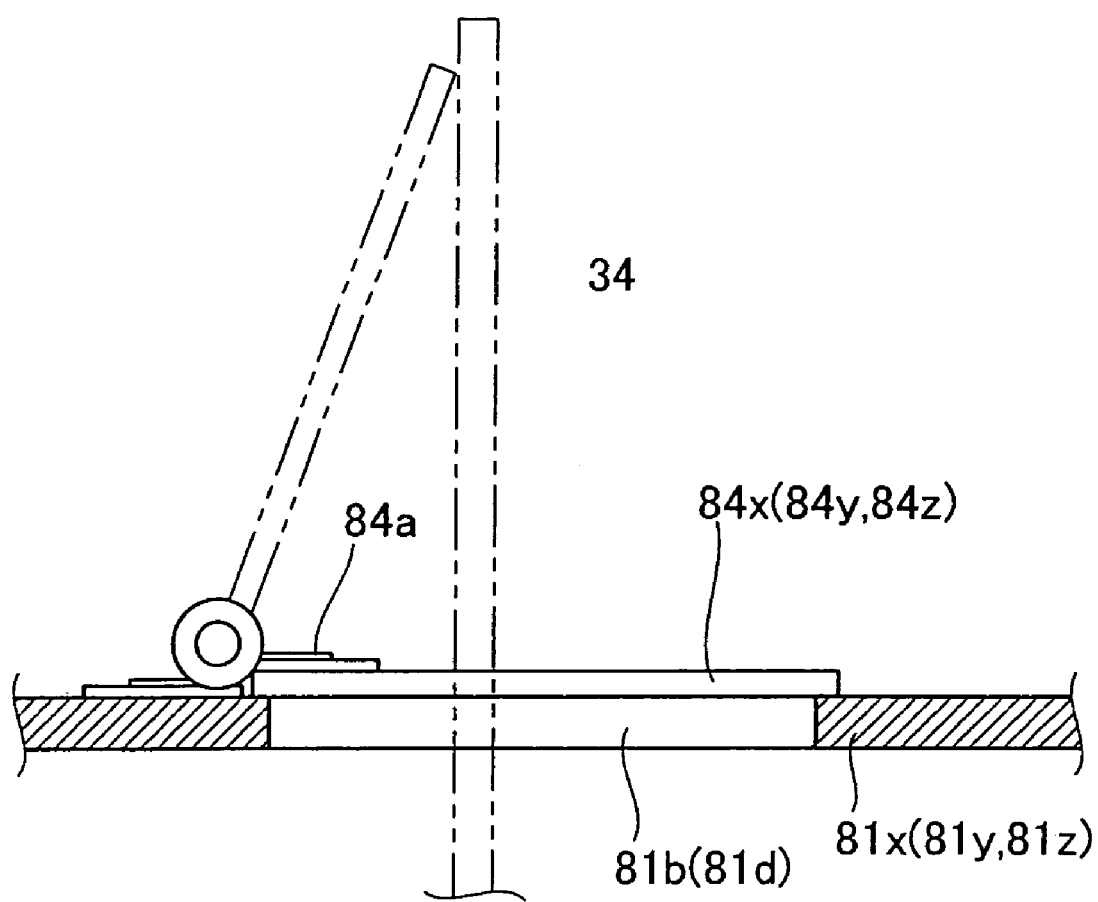
FIG. 21 is across-sectional view showing another example of a substrate accommodating tray pallet of the present invention.

In the above-described embodiment, the shutter members 84x to 84z provided in the shutter body 80 of the substrate accommodating tray pallet A slide relative to the respective plates 81x to 81z. However, the present invention is not limited to this example. For example, as shown in FIG. 21, the shutter members 84x to 84z may be attached to the respective upper surfaces of the plates 81x to 81z such that they can be rotated in a vertical direction. In such a case, a force is applied to the shutter members 84x to 84z by a coil spring 84a so as to close the shutter body openings 81b and 81c. In this structure, the substrate removal tools 34 are inserted upward into the shutter body openings 81b and 81c. The shutter members 84x to 84z rotate upward while being supported by the substrate removal tools 34. Thus, the shutter body openings 81b and 81c are opened.

A substrate to be accommodated in the substrate accommodating tray 10 is not limited to a glass substrate for a display but a substrate such as a semiconductor substrate.

According to the present invention, operation efficiency for removing various types of substrates from a substrate accommodating tray can be improved. Also, it is possible to prevent contamination of the substrate during transporting the substrate accommodating tray.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A substrate accommodating tray pallet for supporting and transferring a plurality of vertically stacked substrate accommodating trays mounted thereon, each tray accommodating a substrate in a horizontal state and having a plurality of openings, the substrate accommodating tray pallet comprising:
    a pallet body defining a plurality of substrate removal insertion openings for inserting substrate removal tools for raising the substrate, the removal insertion openings opposing the plurality of openings in the plurality of vertically stacked substrate accommodating trays mounted on the substrate accommodating tray pallet, such that the substrate removal tool is received through the plurality of removal insertion openings and the openings in the plurality of vertically stacked substrate accommodating trays;
    shutter members that open/close the substrate removal tool insertion openings, the shutter members being integrally attached to the pallet body, wherein the shutter members slide in a horizontal direction to open/close the substrate removal tool insertion openings;
    a force applying section for applying force to the shutter members in a direction to close the substrate removal tool insertion openings; and
    a shutter opening/closing mechanism which slides the shutter members to resist the force applying section in a direction to open the substrate removal tool insertion openings in response to an external force.

2. The substrate accommodating tray pallet according to claim 1, wherein:
    the shutter opening/closing mechanism includes wire connected to the shutter members, and operational tools for sliding the shutter members so as to open the substrate removal tool insertion openings by pulling the wire in response to an external force.

* * * * *